United States Patent [19]
Flock

[11] Patent Number: 5,977,743
[45] Date of Patent: Nov. 2, 1999

[54] CONTROL DEVICE

[75] Inventor: Horst Flock, Reutlingen, Germany

[73] Assignee: Stribel GmbH, Frickenhausen, Germany

[21] Appl. No.: 09/013,622

[22] Filed: Jan. 26, 1998

[30] Foreign Application Priority Data

Jan. 28, 1997 [DE] Germany .......................... 197 02 949

[51] Int. Cl.⁶ .............................. H02P 7/06; H03K 17/06
[52] U.S. Cl. .......................... 318/811; 318/139; 318/254
[58] Field of Search ................................... 318/139, 254, 318/269, 599, 434, 430, 293, 257; 123/192 R, 179 A; 290/40 A; 388/806, 831, 934; 361/20–32

[56] References Cited

U.S. PATENT DOCUMENTS

| | | | |
|---|---|---|---|
| 4,383,245 | 5/1983 | Cooley et al. .................. | 340/347 DA |
| 4,454,454 | 6/1984 | Valentine .................. | 318/293 |
| 4,473,784 | 9/1984 | Morez .................. | 318/439 |
| 4,628,235 | 12/1986 | Goings .................. | 318/430 |
| 4,734,628 | 3/1988 | Bench et al. .................. | 318/309 |
| 4,841,165 | 6/1989 | Bowles .................. | 307/132 R |
| 4,841,207 | 6/1989 | Cheyne .................. | 388/811 |
| 4,856,078 | 8/1989 | Konopka .................. | 388/831 |
| 5,020,491 | 6/1991 | Mashino .................. | 123/192 R |
| 5,070,292 | 12/1991 | Goff .................. | 318/811 |
| 5,363,028 | 11/1994 | Mori .................. | 318/599 |
| 5,708,343 | 1/1998 | Hara et al. .................. | 318/599 |
| 5,811,947 | 9/1998 | Hurst et al. .................. | 318/370 |

FOREIGN PATENT DOCUMENTS

| | | |
|---|---|---|
| 0 365 706 | 5/1990 | European Pat. Off. . |
| 34 05 936 | 8/1985 | Germany . |

*Primary Examiner*—Paul Ip
*Attorney, Agent, or Firm*—Barry R. Lipsitz

[57] ABSTRACT

In order to provide a control device for controlling an inductive load connected to an output, comprising a control circuit which generates a pulse duration modulation signal, an FET final stage switch for connecting a supply current for the load, a switch-on stage and a switch-off stage for the switching on and off of a gate voltage of the final stage switch, and a gate voltage supply for the switch-on stage, with which a reliable connection of the FET final stage switch can be achieved with means which are as simple as possible it is suggested that the gate voltage supply have a charge pump circuit, comprising a diode located between a plus connection and a center tap in forward direction and a capacitor located between the center tap and a minus connection, that the center tap be connected to the switch-on stage and that a potential at the minus connection of the charge pump circuit alter in accordance with a potential at the output and thus the capacitor supply at the center tap a gate supply voltage which corresponds at least to a voltage at the connection of the final stage switch on the supply side.

28 Claims, 2 Drawing Sheets

CONTROL DEVICE

The invention relates to a control device for controlling an inductive load connected to an output, in particular a radiator fan motor of a motor vehicle, comprising a control circuit which, in accordance with a set value, generates a pulse duration modulation signal having successive switch-on and switch-off intervals, an FET final stage switch for connecting a supply current for the load in accordance with the switch-on and switch-off intervals, this current flowing to the output from a voltage supply connection, a switch-on stage and a switch-off stage for the switching on and off of a gate voltage of the final stage switch which are controlled by the control circuit in accordance with the switch-on and switch-off interval of the pulse duration modulation signal, and a gate voltage supply for the switch-on stage for generating a gate supply voltage for the through-connection of the final stage switch during the switch-on interval.

BACKGROUND OF THE INVENTION

A control device of this type is known, for example, from WO 95/28767.

With this circuit, a gate supply voltage of the final stage switch is generated with complicated means.

In addition, DE-A-34 05 936 also discloses a control circuit for an FET final stage switch, in which a diode and a capacitor are present.

However, the capacitor merely serves to charge the gate source capacity of the field effect transistor during switching on. In order to leave this field effect transistor through-connected during the switch-on interval, an additional transistor and a constant current source are required for controlling the transistor and so in this case, as well, the entire gate voltage supply is complicated.

THE INVENTION

Proceeding on the basis of this state of the art, the object underlying the invention is to create a control device of the generic type, with which a reliable connection of the FET final stage switch can be achieved with means which are as simple as possible.

This object is accomplished in accordance with the invention, in a control device of the type described at the outset, in that the gate voltage supply has a charge pump circuit, comprising a diode located between a plus connection and a center tap in forward direction and a capacitor located between the center tap and a minus connection, that the center tap is connected to the switch-on stage and that a potential at the minus connection of the charge pump circuit alters in accordance with a potential at the output and thus a current flowing via the diode charges the capacitor during the switch-off interval and blocks the diode during the entire switch-on interval and the capacitor supplies at the center tap a gate supply voltage which corresponds at least to a voltage at a connection of the final stage switch on the supply side.

The advantage of the inventive solution is thus to be seen first of all in the simplicity of its conception which makes a complicated construction unnecessary.

In addition, the advantage of the inventive solution is to be seen in the fact that such a high gate supply voltage can be generated with it in a simple manner and this ensures a reliable and complete through-connection of the final stage switch.

A particularly preferred embodiment of the inventive solution therefore provides for the gate supply voltage present at the center tap of the charge pump circuit to be supplied to the gate connection in an unregulated manner. The advantage of this solution is the particularly simple and thus inexpensive construction of the inventive control device.

It is expediently provided in an advantageous embodiment of the inventive solution for the capacitor in the charge pump circuit to be dimensioned such that with a maximum switch-off interval and maximum switch-on interval provided for the pulse duration modulation signal this supplies a gate supply voltage during the entire switch-on interval which is greater than the voltage at the connection of the final stage switch on the supply side. As a result of this dimensioning of the capacitor, an adequately high gate supply voltage is made available during the entire switch-on interval without additional measures being required.

Furthermore, it is particularly favorable when the leakage currents during the generation of the gate voltage discharge the capacitor during the entire switch-on interval only to the extent that its voltage at the end of the maximum switch-on interval is greater than the voltage at the connection of the final stage switch on the supply side.

It is, in particular, advantageous when the capacitor is dimensioned such that it is discharged during the maximum switch-on interval by no more than half. In this case, the drop in the gate supply voltage can be kept so slight that it does not have any negative effect on the change in the control of the final stage switch associated therewith.

It is even better when the capacitor is dimensioned such that it is discharged during the maximum switch-on interval by less than 20%, even better less than 10%.

A particularly advantageous solution with respect to the through-connection of the final stage switch provides for the gate supply voltage to be at least 3 volts above the voltage at the connection of the final stage switch on the supply side during the entire switch-on interval. It is thus ensured that during the entire switch-on interval the final stage switch is always completely through-connected so that variations in the gate supply voltage also do not have any effect on the through-connection of the final stage switch.

A particularly favorable solution of an inventive control device provides for the minus connection of the charge pump circuit to be at a potential between that of the connection of the final stage switch on the output side and that of the output. This solution ensures that the potential of the minus connection varies in accordance with the potential of the output but leaves open to what extent the potential of the minus connection directly corresponds to that of the output.

Furthermore, a particularly advantageous realization of the inventive control device provides for the plus connection of the charge pump circuit to be at a potential which corresponds at least to that at the connection of the final stage switch on the supply side.

A particularly simple and favorable realization of the inventive solution provides for the plus connection of the charge pump circuit to be connected to a supply line of the control device.

In this respect, the supply line preferably has a stabilized voltage so that damage to the final stage switch as a result of an excessive gate supply voltage is precluded.

The voltage at the plus connection can be stabilized in a particularly simple manner against drops when a capacitor is used for this purpose which is utilized, in particular, for ensuring a rapid charging of the capacity of the charge pump circuit immediately after transition from the switch-on interval to the switch-off interval.

A particularly advantageous embodiment of an inventive control device provides for the gate voltage supply to comprise exclusively diodes and capacitors and thus no components, such as, for example, transistors, are, in particular, necessary for regulating the gate supply voltage.

In conjunction with the preceding explanations concerning the individual embodiments, no details have been given concerning the design of the switch-on stage.

In order to avoid voltage peaks in the case of the inductive load, it is preferably provided for a timing circuit designed as a low pass to be associated with the switch-on stage; the increase in the gate voltage during switching on can be determined with the aid of this timing circuit.

In this respect, it is preferably provided for a capacitor of the low pass to be located between the gate connection and ground.

The switch-on stage itself can be designed in the most varied of ways. One advantageous design of the switch-on stage provides for this to have a switching transistor controllable by the control circuit.

Similarly, a timing circuit designed as a low pass is associated with the switch-off stage, in particular, for avoiding negative voltage peaks during the switching off.

In this respect, the timing circuit associated with the switch-off stage preferably operates with the same capacitor between the gate connection and ground.

Furthermore, the switch-off stage is likewise preferably designed such that it has a switching transistor connected by the control circuit.

It is preferably provided for a time constant of the low pass for the switching on and/or the switching off to be greater by at least a factor of five than a time constant of a free-wheeling diode connected in parallel to the load so that the occurrence of voltage peaks can be avoided as far as possible.

A further, inventive concept which is to be seen as an alternative or supplementary to the inventive concept specified in the above comprises a control device for controlling a load, in particular, a radiator fan motor of a motor vehicle, comprising a control circuit which generates in accordance with a set value a pulse duration modulation signal having successive switch-on intervals and switch-off intervals, a switch-on stage and a switch-off stage which, in accordance with the pulse duration modulation signal, connect the supply current for the load via a final stage switch in a pulse duration modulated manner, wherein in accordance with the invention a measurement tap connected to a measurement circuit is provided between the final stage switch and the load, and wherein a monitoring circuit generates a measurement switch-off interval by suppressing at least one pulse duration modulation switch-on interval, monitors the voltage at the measurement tap with the measurement circuit within the measurement switch-off interval and compares it to a reference value.

The advantage of the inventive solution is to be seen in the fact that this creates the possibility of monitoring the free-running behavior of the load and thus of checking functional failures of the load.

If the load is, for example, a dc motor, it may, for example, be monitored during the measurement switch-off interval whether the motor continues to run in a free-running manner or is blocked.

In principle, it would be conceivable to monitor the voltage at the measurement tap during the entire measurement switch-off interval. This is, however, complicated and requires a considerable storage capacity.

For this reason, a particularly simple and advantageous solution provides for the measurement circuit to determine the voltage at the measurement tap at a predetermined monitoring time within the measurement interval.

If the monitoring time is determined in coordination with the behavior of the load, for example, the time-lag of the dc motor, it can thus be calculated with sufficient accuracy whether the dc motor is blocked or continues to run.

The question, in particular, of whether a motor is blocked or continues to run may be determined with a particularly simple process, namely by the monitoring circuit checking whether the voltage at the measurement tap exceeds a minimum value or not at the specific monitoring time. If the minimum value is exceeded, it is to be assumed that the dc motor displays an adequate time-lag behavior.

Since any checking of the load is necessary and relevant only at relatively large time intervals, it is preferably provided for the monitoring circuit to initiate a measurement switch-off interval periodically, for example, after a specific period of time.

A further development of the inventive control device provides for an additional measurement circuit to be provided which detects a supply voltage of the control device.

Monitoring tasks relating to the load may likewise be carried out with the detection of the supply voltage.

One advantageous embodiment, for example, provides for the monitoring circuit to generate a measurement switch-on interval of a defined duration and to detect the supply voltage under load at the beginning and at the end of this measurement switch-on interval and for the monitoring circuit to determine the difference between the supply voltage at the beginning and at the end of the measurement switch-on interval and compare it to a reference value.

The difference in the supply voltage at the beginning and at the end of the measurement switch-on interval gives a measurement as to the extent, to which the load has a reasonable size and does not put too great or too little a strain on the control device.

It is, for example, provided for the monitoring circuit to report a missing load at a difference which is smaller than a minimum reference value.

Alternatively thereto, it is, however, also conceivable for the monitoring circuit to report a short circuit when a maximum reference value is exceeded since, in this case, the load puts too great a strain on the control device.

In both cases, it is, however, also conceivable to design the monitoring circuit such that this switches off the control device in the case of a missing load or in the case of a short circuit.

The measurement switch-on interval which is initiated by the monitoring circuit could, for example, be a switch-on interval dependent on pulse duration modulation. Since such a switch-on interval can, however, be too short in many cases and thus faulty measurements can occur, it is preferably provided for the monitoring circuit to generate a measurement switch-on interval independent of pulse duration modulation.

In principle, it would be conceivable to have such a measurement switch-on interval following each optional measurement switch-off interval.

Since, however, the switch-off intervals which are dependent on pulse duration modulation can, in particular, be very short and thus the supply voltage can recover negligibly from the strain as a result of the load in these short switch-off intervals, an advantageous embodiment provides for the monitoring circuit to generate the measurement switch-on interval immediately following the measurement switch-off interval.

Additional features and advantages of the inventive solution are the subject matter of the description as well as the drawings illustrating one embodiment.

PREFERRED EMBODIMENT

Figure 1:
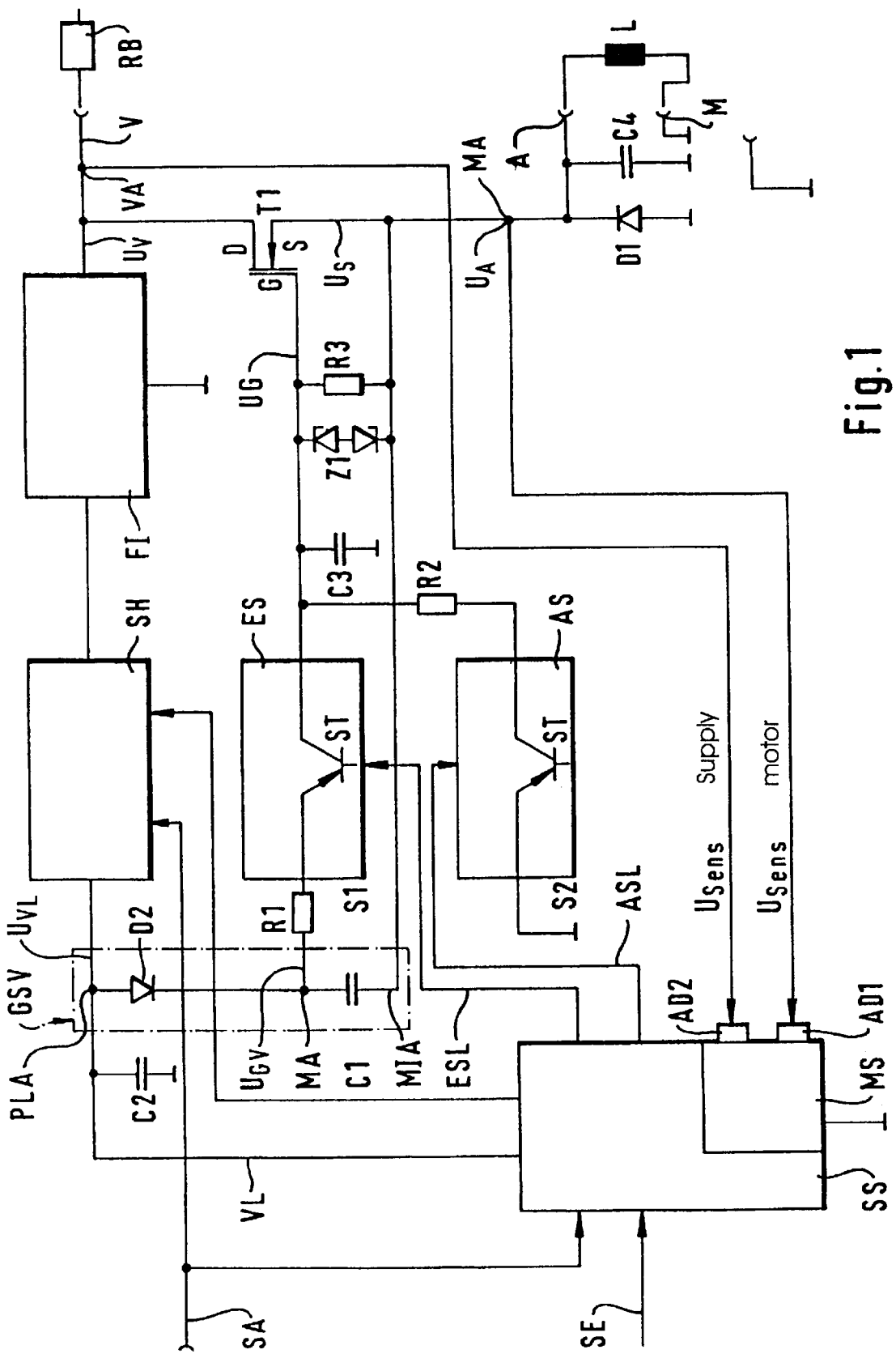
FIG. 1 shows a schematic circuit of an inventive control device.

One embodiment of an inventive control device, illustrated in FIG. 1, comprises an N-channel MOSFET transistor T1 as final stage switch, the drain connection D of which is connected to a voltage supply connection V for a supply voltage $U_V$. This supply voltage $U_V$ is, for example, the +12 volt power supply of a motor vehicle.

A source connection S of the final stage switch T1 is connected to an output A.

An, in particular, inductive load L is located between the output A and ground M and is represented, for example, by a motor of a radiator fan of a motor vehicle. Furthermore, a capacitor C4 and a free-wheeling diode D1 are also located between the output A and the ground M. This free-wheeling diode D1 serves to permit a flow of current between the ground M and the output A when the final stage switch T1 is switched off, as a result of which any voltage peak occurring on account of the inductive load is reduced.

The final stage switch T1 is controlled via a gate connection G thereof by means of a switch-on stage ES and a switch-off stage AS which allow control of a gate voltage UG at the gate connection.

The switch-on stage ES and the switch-off stage AS are both controlled via a control circuit SS, to which a set value for a pulse duration modulation signal can be specified via a set value input line SE. Furthermore, the control circuit SS can be activated via a system activation line SA.

Current is supplied to the control circuit SS via a filter FI connected to the output of the voltage supply connection V and a holding circuit SH which is arranged after this filter, is connected to a supply line VL of the control circuit SS and generates a voltage $U_{VL}$ in this.

A capacitor C2 is located between the supply line VL and the ground M. Furthermore, a diode D2 is connected to the supply line SL and is connected in series with a capacitor C1 which, for its part, is again connected to the output A. The diode D2 is therefore connected such that current can flow from the supply line VL to the capacitor C1, namely for charging it, when the final stage switch T1 is switched off and thus the capacitor C1 is connected to the ground.

The diode D2 and the capacitor C1 form a gate voltage supply GSV designed as a charge pump circuit with a plus connection PLA connected to the supply line VL and a minus connection MIK connected to the output A, wherein a gate supply voltage $U_{GV}$ is available at a center tap MA.

The switch-on stage ES, which has a switching transistor ST controllable, for its part, via a switch-on control line ESL connected to the control circuit SS, is connected via a resistor R1 to the center tap MA located between the diode D2 and the capacitor C2. When the switch-on stage ES is through-connected, current flows from the center tap MA via the resistor R1 to the gate connection G of the final stage switch T1, wherein the gate supply voltage UG is formed.

To delay the increase in the gate supply voltage UG immediately following the switching on of the switch-on stage ES, the gate connection G of the final stage switch T1 is connected to ground via a capacitor C3, wherein the resistor R1 and the capacitor C3 form an RC element which allows the gate supply voltage UG to increase with a defined time delay immediately following the switching on of the switch-on stage ES and thus limits any edge steepness of an increase in a corresponding source voltage US, as well.

To protect the gate supply voltage UG, a row of Zener diodes Z1 and parallel thereto a resistor R3 are located between the gate connection G of the final stage switch T1 and the source connection S thereof or the output A, wherein the resistor R3 serves to maintain this state when final stage switch T1 is switched off.

The switch-off stage AS likewise comprises a switching transistor ST and serves to connect the gate connection G of the final stage switch T1 to ground M, wherein a resistor R2 is located between the switch-off stage AS and the gate connection G of the final stage switch T1 and this resistor likewise forms with the capacitor C3 an RC element, by means of which any drop in the gate supply voltage UG can be determined with a defined time delay and thus a corresponding drop in the source voltage US.

The RC elements R1 C3 and R2 C3 preferably have a comparable, favorably an identical time constant.

The diode D2 forms with the capacitor C1 a charge pump for generating a gate supply voltage UG which is higher than the voltage $U_V$ at the supply voltage connection V of the control device.

The inventive control device operates as follows.

When the control device is activated via the system activation line SA, the holding circuit SH, on the one hand, and the control circuit SS, on the other hand, are activated. This means that the voltage $U_{VL}$ is applied to the supply line VL and this corresponds approximately to the voltage $U_V$ at the voltage supply connection V.

Furthermore, the final stage switch T1 is switched off in this state and so the capacitor C1 is charged, on the one hand, via current flowing from the supply line VL through the diode D2 and via center tap MA and, on the other hand, via current flowing via the load L to the output A and from there to the capacitor C1. The voltage, with which the capacitor C1 is charged, corresponds essentially to the voltage $U_{VL}$ which is then also present at the center tap MA.

If the switch-on stage ES is now activated by means of the control circuit SS and its switching transistor ST through-connected, the voltage $U_{VL}$ present at the center tap MA results in current flowing via the resistor R1 to the gate connection G of the final stage switch T1 and the gate voltage UG building up, delayed in time by the RC element R1, C3.

With gate voltage UG building up, the final stage switch T1 is connected through and the source voltage US, which corresponds approximately to the potential at the ground M in the initial state with the final stage switch T1 switched off, increases since the current flowing via the final stage switch T1, the output A and the load L to the ground M causes the potential at the source connection S of the final stage switch T1 to increase, namely at the most to approximately the supply voltage $U_V$ at the supply voltage connection V when the final stage switch T1 is fully through-connected. The voltage present at the capacitor C1 is added to this source voltage US and so a gate supply voltage UG can be reached which corresponds at the most to approximately double the supply voltage $U_V$ when $U_V$ is approximately equal to $U_{VL}$.

The capacitor C1 is dimensioned such that its charge is sufficient to supply gate supply voltage UG during the longest possible switch-on interval EIV of the pulse duration modulation signal generated by the control circuit SS, this voltage being distinctly higher than $U_V$, wherein UG is preferably at least 3, even better 5 volts above the source voltage US.

For switching off, the control circuit controls the switching transistor ST of the switch-off stage AS via the switch-off line ASL and at the same time switches off the switching transistor of the switch-on stage ES via the switch-on control line ESL so that the gate connection G of the final stage switch T1 is now connected to the ground M via the switch-off stage AS and the resistor R2. The drop in the gate voltage UG is thereby limited by the RC element C3, R2.

When the final stage switch T1 is switched off, the capacitor C1 is again charged since the source voltage US, in this case, again comes closer to essentially the value zero.

Furthermore, the capacitor C2 serves to cause a sufficiently large current to flow via the diode D2 after switching off of the final stage switch T1 in order to charge the capacitor C1 as rapidly as possible.

Depending on the size selected for the RC element R2, C3, more or less large negative switch-off peaks occur at the source connection S of the final stage switch T1 on account of the free-wheeling diode D1, caused by the inductive load, and these can be used to additionally charge the capacitor C1 to a voltage which, in the end, is larger than the supply voltage UV at the voltage supply connection V.

The capacity of the capacitor C1 is preferably selected to be of such a size that during the entire switch-on duration of the final stage switch T1 the gate supply voltage UVG and, consequently, in this case the gate voltage UG approximately, as well, is always above the voltage at the drain connection D of the final stage switch T1 by at least 5 volts.

Furthermore, the capacitors C1 and C2 are dimensioned such that the capacitor C1 is charged so quickly after the switching off of the final stage switch T1 that the minimum switch-off duration of the pulse duration modulation signal can be less than 10% of the switch-on duration, preferably at approximately 1% thereof.

The time constant of the RC elements R1, C3 and R2, C3 is preferably selected such that this is at 120 nanoseconds whereas the switching delay of the free-wheeling diode D1 is selected such that this is at approximately one tenth of the time constant of the RC elements R1, C3 and R2, C3 or less, i.e. at approximately 12 nanoseconds or less.

Figure 2:
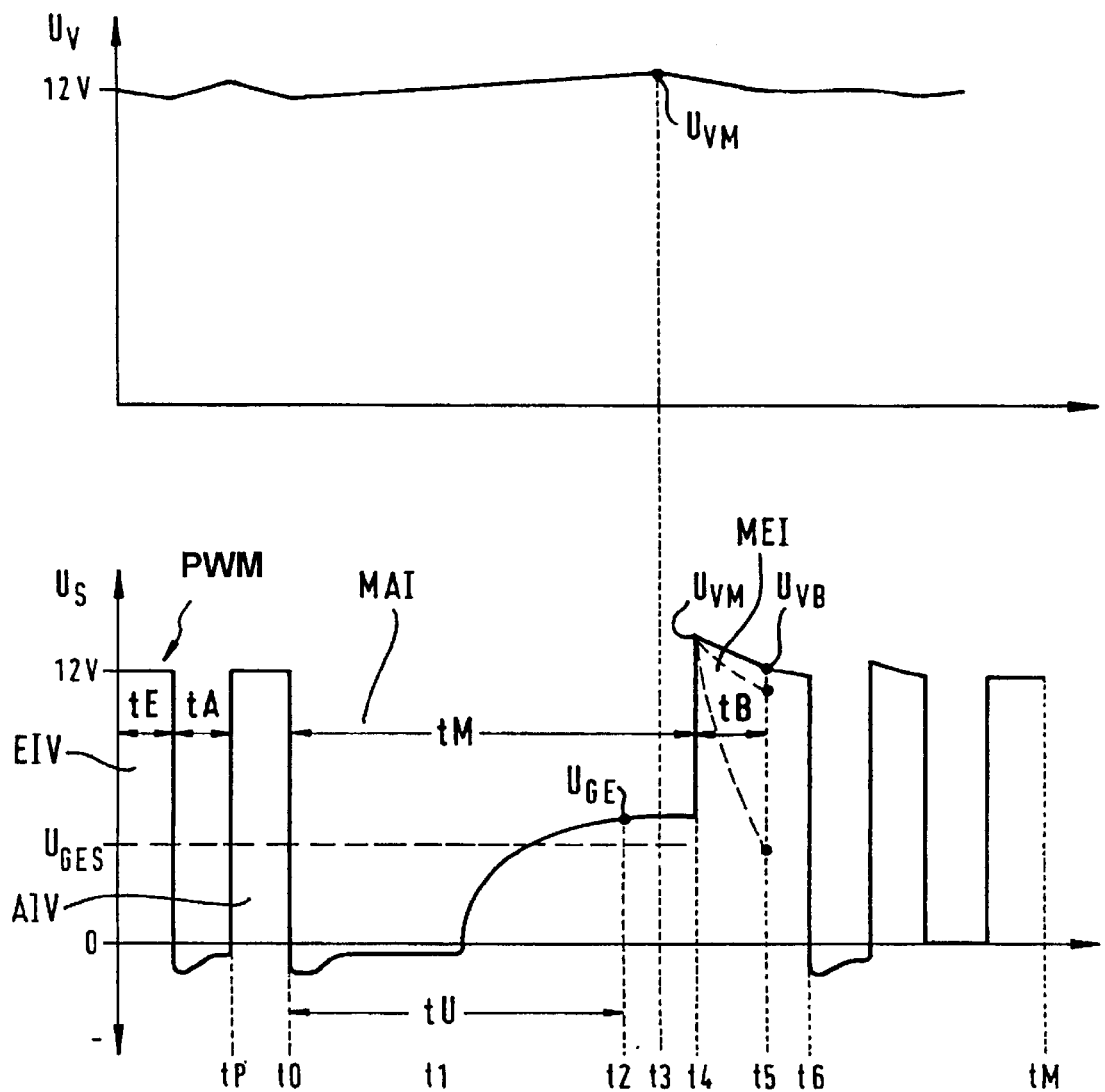
FIG. 2 shows an illustration of pulse duration modulation signals, measurement switch-off intervals and measurement switch-on intervals in the inventive control device.

The pulse duration modulation signal which can be generated with the inventive control device is illustrated in FIG. 2 in the lower portion, wherein the switch-on duration tE of the switch-on interval EIV and the switch-off duration tA of the switch-off interval AIV are approximately equal in the case of the pulse duration modulation signal illustrated by way of example. The period duration of the pulse duration modulation signal is tP.

Furthermore, FIG. 2 shows the negative voltage peak which occurs during the switch-off duration tA on account of the inductive load and the free-wheeling diode D1.

The inventive control device comprises, in addition to the control circuit SS, a measurement circuit MS communicating with the control circuit SS, wherein the control circuit SS operates at the same time as monitoring circuit.

The voltage $U_A$ is monitored with the measurement circuit MS via a first analog-digital converter AD1 at a measurement tap MA, which is connected to the output A, during a measurement period tM of a measurement switch-off interval MAI, during which the final stage switch T1 is switched off.

During this measurement period tM, as illustrated in FIG. 2, the negative voltage peak caused by the inductive load L occurs as UA after the last switching off of the final stage switch T1 but this voltage peak is reduced as a result of the free-wheeling diode D1 and changes into positive values which occur on account of the continued running of the radiator fan motor forming the load L as a generator. The radiation fan motor thereby generates a generator voltage UGE which amounts at the most to approximately half the supply voltage $U_V$ at the supply voltage connection V at a degree of efficiency of approximately 50%.

In order to calculate the generator voltage UGE of the radiator fan motor, the measurement of the voltage UA measurable at the measurement tap MA is taken at a defined monitoring time tU following the last switching off of the pulse duration modulation switch-on interval EIV.

The measurement circuit MS evaluates the value of the generator voltage UGE in accordance with its measured voltage, wherein it is apparent with the occurrence of the generator voltage UGE and the size thereof at the respectively predetermined monitoring time tU whether the radiator fan motor serving as load L continues to run freely or, for example, does not continue to run and is blocked.

This means that the measurement circuit MS merely needs to ascertain whether the generator voltage UGE is above a set value UGES in order to be certain that the radiator fan motor is not blocked but continues to run unhindered.

The switching off of the pulse duration modulation signal does, however, also have the effect that the capacitors provided in the filter FI are charged and the supply voltage $U_V$ can recover to a maximum value $U_{VM}$.

If, following the measurement switch-off interval MAI, the final stage switch T1 is through-connected during a measurement switch-on interval MEI with a load period tB, the supply voltage $U_V$ is reduced from the maximum value $U_{VM}$ to a load value $U_{VB}$ which is caused by the fact that a discharge of the capacitors in the filter FI takes place since the power supply which supplies the supply voltage $U_V$ itself has a resistor.

The supply voltage UV can be measured by means of an analog-digital converter AD2 at a supply voltage tap VA connected to the supply voltage connection V and interrogated by the measurement circuit MS, wherein the difference between the maximum voltage $U_{VM}$ and the voltage $U_{VB}$ following a load period tB makes it apparent to what extent the load L connected to the connection A allows a designated current to flow and thus is present at all or—for example, on account of a short circuit—allows too great a current to flow.

If the difference between the value $U_{VM}$ and $U_{VB}$ is approximately equal to zero, the measurement circuit MS can recognize that no load L is connected.

If the difference between the voltage $U_{VM}$ and $U_{VB}$ is, for example, in the order of magnitude of less than 1 volt but greater than 0.5 volts, a load corresponding to the dimensioning is, for example, connected.

If the difference between UVM and UVB is at voltages of greater than 2 to 3 volts, too great a strain is present at the output A as a result of the load L which displays, for example, a short circuit and the control circuit SS can take this as a reason to deactivate the control device by switching off the holding circuit SH.

I claim:

1. Control device for controlling an inductive load connected to an output, in particular a radiator fan motor of a motor vehicle, comprising a control circuit generating in accordance with a set value a pulse duration modulation signal having successive switch-on and switch-off intervals, an FET final stage switch for connecting a supply current for the load in accordance with the switch-on and switch-off intervals, said supply current flowing to the output from a voltage supply connection, a switch-on state and a switch-off stage for the switching on and off of a gate voltage of the final stage switch, said stages being controlled by the control circuit in accordance with the switch-on and switch-off interval of the pulse duration modulation signal, and a gate voltage supply for the switch-on stage for generating a gate supply voltage for the through-connection of the final stage switch during the switch-on interval, characterized in that the gate voltage supply (GSV) has a charge pump circuit, comprising a diode (D2) located between a plus connection (PLA) and a center tap (MA) in forward direction and a capacitor (C1) located between the center tap (MA) and a minus connection (MIA), that the center tap (MA) is connected to the switch-on stage (ES) and that a potential at the minus connection (MIA) of the charge pump circuit alters in accordance with a potential at the output (A) and thus a current flowing via the diode (D2) charges the capacitor (C1) during the switch-off interval (AIV) and blocks the diode (D2) during the entire switch-on interval (EIV) and the capacitor (C1) supplies at the center tap (MA) a gate supply voltage ($U_{GV}$) corresponding at least to a voltage at the connection (D) of the final stage switch (T1) on the supply side.

2. Control device as defined in claim 1, characterized in that the gate supply voltage ($U_{GV}$) is adapted to be supplied to the gate connection of the final stage switch (T1) in an unregulated manner.

3. Control device as defined in claim 1, characterized in that the capacitor (C1) in the charge pump circuit is dimensioned such that with a minimum switch-off interval (AIV) and maximum switch-on interval (EIV) provided for the pulse duration modulation signal it supplies during the entire switch-on interval (EIV) a gate supply voltage ($U_{GV}$) greater than the voltage at the connection (D) of the final stage switch (T1) on the supply side.

4. Control device as defined in claim 1, characterized in that the leakage currents during the generation of the gate voltage ($U_G$) discharge the capacitor (C1) during the entire switch-on interval (EIV) only to the extent that its voltage at the end of the maximum switch-on interval (EIV) is greater than the voltage at the connection (D) of the final stage switch (T1) on the supply side.

5. Control device as defined in claim 1, characterized in that the capacitor (C1) is dimensioned such that it is discharged during the maximum, switch-on interval (EIV) by no more than half.

6. Control device as defined in claim 1, characterized in that the gate supply voltage ($U_{GV}$) is at least 3 volts above the voltage at the connection (D) of the final stage switch (T1) on the supply side during the entire switch-on interval.

7. Control device as defined in claim 1, characterized in that the minus connection (MIA) of the charge pump circuit is at a potential between that of the connection (S) of the final stage switch (T1) on the output side and that of the output (A).

8. Control device as defined in claim 1, characterized in that the plus connection (PLA) of the charge pump circuit is at a potential corresponding at least to that at the connection (D) of the final stage switch (T1) on the supply side.

9. Control device as defined in claim 1, characterized in that the plus connection (PLA) of the charge pump circuit is connected to a supply line (VL) of the control device.

10. Control device as defined in claim 9, characterized in that the supply line (VL) is at a stabilized voltage ($U_{VL}$).

11. Control device as defined in claim 1, characterized in that the voltage ($U_{VL}$) at the plus connection (PLA) of the charge pump circuit is stabilized via a capacitor (C2).

12. Control device as defined in claim 1, characterized in that the gate voltage supply (GSV) comprises exclusively diodes (D1) and capacitors (C1).

13. Control device as defined in claim 1, characterized in that a timing circuit (R1, C3) designed as a low pass is associated with the switch-on stage (ES).

14. Control device as defined in claim 13, characterized in that a capacitor (C3) of the low pass (R1, C3) is located between the gate connection (G) and ground (M).

15. Control device as defined in claim 1, characterized in that the switch-on stage (ES) has a switching transistor (ST) controllable by the control circuit (SS).

16. Control device as defined in claim 1, characterized in that a timing circuit (R2, C3) designed as a low pass is associated with the switch-off stage (AS).

17. Control device as defined in claim 1, characterized in that the switch-off stage (AS) has a switching transistor (ST) connected by the control circuit (SS).

18. Control device as defined in claim 1, characterized in that a time constant of the low pass for the switching on (R1, C3) and/or the switching off (R2, C3) is greater by at least a factor of five than a time constant of a free-wheeling diode (D1) connected in parallel to the load (L).

19. Control device for controlling a load, in particular a radiator fan motor of a motor vehicle, comprising a control circuit generating in accordance with a set value a pulse duration modulation signal having successive switch-on intervals and switch-off intervals, a switch-on stage and a switch-off stage connecting the supply current for the load via a final stage switch in accordance with the pulse duration modulation signal in a pulse duration modulated manner, characterized in that a measurement tap (MA) connected to a measurement circuit (MS) is provided between the final stage switch (T1) and the load (L), and that a monitoring circuit (SS) generates a measurement switch-off interval (MA) by suppressing at least one pulse duration modulation switch-on interval (MIV) and monitors the voltage ($U_A$) at the measurement tap (MA) with the measurement circuit (MS) within the measurement switch-off interval (MA) and compares it to a reference value ($U_{GES}$).

20. Control device as defined in claim 19, characterized in that the measurement circuit (MS) determines the voltage at the measurement tap (MA) at a predetermined monitoring time (tU) within the measurement switch-off interval (MAI).

21. Control device as defined in claim 19, characterized in that the monitoring circuit (SS) checks whether the voltage ($U_A$) at the measurement tap (MA) exceeds a minimum value ($U_{GES}$).

22. Control device as defined in claim 19, characterized in that the monitoring circuit (SS) initiates a measurement switch-off interval (MAI) periodically.

23. Control device as defined in claim 19, characterized in that an additional measurement circuit (MS) is provided for detecting a supply voltage ($U_V$) of the control device.

24. Control device as defined in claim 23, characterized in that the monitoring circuit (SS) generates a measurement switch-on interval (MEI) of a defined duration and detects the supply voltage ($U_V$) under load (L) at the beginning and at the end of this measurement switch-on interval (MEI) and that the monitoring circuit (SS) determines the difference between the supply voltage at the beginning ($U_{VM}$) and at the end ($U_{VB}$) of the measurement switch-on interval (MEI) and compare this to a reference value.

25. Control device as defined in claim 24, characterized in that the monitoring circuit (SS) reports a missing load at a difference smaller than a minimum reference value.

26. Control device as defined in claim 24, characterized in that the monitoring circuit (SS) reports a short circuit when a maximum reference value is exceeded.

27. Control device as defined in claim 24, characterized in that the monitoring circuit (SS) generates a measurement switch-on interval (MEI) independent of pulse duration modulation.

28. Control device as defined in claim 24, characterized in that the monitoring circuit (SS) generates the measurement switch-on interval (MEI) immediately following the measurement switch-off interval (MAI).

* * * * *